(12) United States Patent
Park et al.

(10) Patent No.: US 7,902,991 B2
(45) Date of Patent: Mar. 8, 2011

(54) FREQUENCY MONITORING TO DETECT PLASMA PROCESS ABNORMALITY

(75) Inventors: Beom Soo Park, San Jose, CA (US);
Soo Young Choi, Fremont, CA (US);
John M. White, Hayward, CA (US);
Hong Soon Kim, San Jose, CA (US);
James Hoffman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 752 days.

(21) Appl. No.: 11/682,290

(22) Filed: Mar. 5, 2007

(65) Prior Publication Data

US 2008/0074255 A1 Mar. 27, 2008

Related U.S. Application Data

(60) Provisional application No. 60/826,539, filed on Sep. 21, 2006.

(51) Int. Cl.
*G08B 21/00* (2006.01)

(52) U.S. Cl. ............... 340/658; 315/111.21; 340/540; 340/679

(58) Field of Classification Search .......... 340/679, 340/680, 540, 658; 315/111.21; 219/121.36
See application file for complete search history.

(56) References Cited

U.S. PATENT DOCUMENTS

| | | | |
|---|---|---|---|
| 3,020,529 A | 2/1962 | Turner | |
| 3,519,927 A | 7/1970 | Holt | |
| 4,588,952 A | 5/1986 | Matsuoka | |
| 5,543,689 A * | 8/1996 | Ohta et al. | 315/111.21 |
| 5,643,364 A | 7/1997 | Zhao et al. | |
| 5,654,679 A | 8/1997 | Mavretic et al. | |
| 5,810,963 A | 9/1998 | Tomioka | |
| 6,124,758 A | 9/2000 | Korte et al. | |
| 6,528,949 B2 | 3/2003 | Hao | |
| 6,677,711 B2 | 1/2004 | MacGearailt | |
| 6,703,080 B2 | 3/2004 | Reyzelman et al. | |
| 6,718,272 B1 | 4/2004 | Fisk et al. | |
| 6,799,532 B2 | 10/2004 | Sirkis et al. | |
| 6,954,077 B2 | 10/2005 | Strang | |
| 7,292,045 B2 | 11/2007 | Anwar et al. | |
| 7,514,936 B2 | 4/2009 | Anwar et al. | |
| 2003/0063420 A1 | 4/2003 | Pahl et al. | |
| 2003/0097984 A1 * | 5/2003 | Nakano et al. | 118/712 |
| 2004/0097089 A1 * | 5/2004 | Ohmi et al. | 438/706 |
| 2005/0119864 A1 | 6/2005 | Coumou et al. | |
| 2006/0032584 A1 * | 2/2006 | Itabashi et al. | 156/345.44 |
| 2006/0252283 A1 | 11/2006 | Takeda et al. | |
| 2006/0259259 A1 | 11/2006 | Rozenboim et al. | |

\* cited by examiner

*Primary Examiner* — Thomas J Mullen

(74) *Attorney, Agent, or Firm* — Robert J. Stern

(57) ABSTRACT

Abnormal conditions within an RF-powered plasma process chamber are detected by detecting whether the frequency of a variable-frequency RF power supply moves outside established lower and upper limits. In a first aspect, a first pair of lower and upper limits are established as a function of the frequency of the power supply sampled after a new process step begins or after a sample control signal changes state. In a second aspect, a second pair of lower and upper limits are not adapted to the frequency of the power supply. Both aspects preferably are used together to detect different occurrences of abnormal conditions.

28 Claims, 4 Drawing Sheets

FREQUENCY MONITORING TO DETECT PLASMA PROCESS ABNORMALITY

CROSS REFERENCE TO RELATED APPLICATION

This application claims the benefit of U.S. Provisional application No. 60/826,539 filed Sep. 21, 2006.

FIELD OF THE INVENTION

The invention relates to apparatus and methods for detecting abnormal conditions within an RF-powered plasma process chamber that is coupled to a variable-frequency RF power supply, especially a process chamber for fabricating an electronic workpiece such as an electronic display or semiconductor circuit.

BACKGROUND OF THE INVENTION

Electronic devices such as electronic flat panel displays and semiconductor integrated circuits generally are manufactured by performing a sequence of process steps in various process chambers. Such process steps commonly include steps performed within plasma process chambers, such as a deposition step performed in a plasma-enhanced chemical vapor deposition chamber or a plasma sputtering chamber, or an etch step performed in a plasma etch chamber. Any chamber for performing a step in the manufacture of an electronic device while a plasma exists within the chamber is considered a plasma process chamber.

Malfunctions sometimes occur while a workpiece is undergoing processing within a plasma process chamber. Such malfunctions can include a damaged chamber component, a chamber component that requires cleaning or other routine maintenance, or a damaged workpiece. If a plasma process is not halted after a malfunction occurs, there is a risk of producing more serious damage to the chamber components or the workpiece. Therefore, it is important to detect such malfunctions as quickly as possible so that the plasma process can be halted.

SUMMARY OF THE INVENTION

The invention is an apparatus and method for detecting abnormal conditions within an RF-powered plasma process chamber by detecting whether the frequency of a variable-frequency RF power supply moves outside established lower and upper limits.

The invention is most useful in combination with an impedance matching network and RF power supply in which the frequency of the RF power supply is adjusted to optimize the impedance match among the RF power supply, the matching network and the plasma process chamber, so that the frequency of the RF power supply changes in response to changes in the load impedance presented by the plasma process chamber.

A first aspect of the invention adaptively establishes a first pair of lower and upper frequency limits. After a new process step begins or after a sample control signal changes from a first state to a second state, a sample-and-hold circuit samples the frequency of the RF power supply. The first pair of lower and upper frequency limits are established as a function of the sampled frequency.

A first comparator circuit repeatedly (i.e., periodically or continuously) compares the frequency of the RF power supply with the first frequency limits and signals an alert if the frequency becomes less than the first lower limit or greater than the first upper limit.

The first frequency limits preferably are established such that the power supply frequency remains between the lower and upper frequency limits while the process chamber is operating normally. Consequently, an excursion of the power supply frequency outside the frequency limits reliably indicates an abnormal condition within the process chamber, such as a damaged chamber component, a chamber component that requires cleaning or other routine maintenance, or a damaged workpiece.

The first frequency limits preferably are updated when plasma processing of a new workpiece begins or after any change in the state of the workpiece processing. The updating is performed by repeating the foregoing steps of sampling the frequency of the RF power supply and establishing the first frequency limits as a function of the sampled frequency.

This updating inherently adapts the frequency limits to drifts in the process chamber conditions, thereby enabling the frequency limits to be more narrowly spaced than if frequency limits were fixed. Accordingly, the adaptively established frequency limits can more sensitively detect abnormal conditions in the process chamber than frequency limits that are fixed and more widely spaced.

A second aspect of the invention establishes a second pair of lower and upper frequency limits that are not adaptively updated as a function of the power supply frequency. A comparator circuit compares the frequency of the RF power supply with the second pair of frequency limits and, if the power supply frequency is outside the limits, the comparator circuit signals a second alert signifying an abnormal condition in the process chamber. The comparison preferably is performed upon a change in the state of the workpiece processing, such as when plasma processing of a new workpiece begins or after any change in the state of the workpiece processing.

Although either of the first and second aspects of the invention can be used independently of the other, they preferably are used together because they have complementary and synergistic advantages and shortcomings. Specifically, although the second frequency limits generally must be more widely spaced than the first frequency limits because they do not adapt as a function of the power supply frequency, the second aspect of the invention has the advantage of enabling detection of abnormal conditions that occur when no process is being performed, such as ground strap breakage while a workpiece is being transferred into or out of the chamber.

DETAILED DESCRIPTION OF THE PREFERRED EMBODIMENTS

1. Overview of Plasma Process

Figure 1:
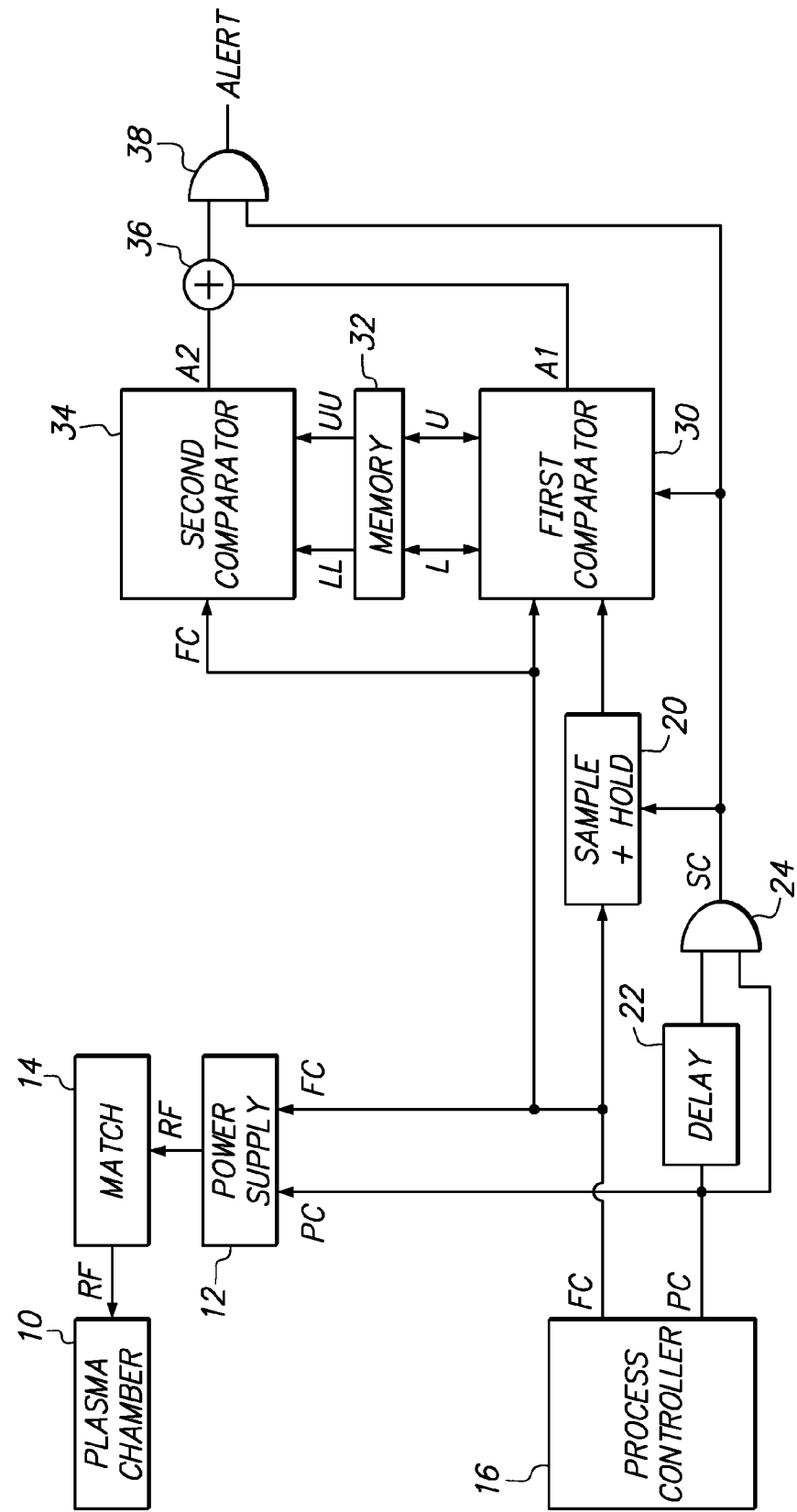
FIG. 1 is a block diagram of an apparatus for detecting abnormal conditions in a process chamber according to the invention.

FIG. 1 shows a conventional RF-powered plasma process chamber 10 and a novel electrical circuit 20-24 according to the present invention for detecting abnormal conditions within the process chamber.

The plasma process chamber can be any type of chamber for performing a plasma process useful for manufacturing electronic devices such as electronic displays or semiconductor integrated circuits. For example, the plasma process chamber can be a plasma-enhanced chemical vapor deposition chamber, a sputtering chamber, or a plasma etch chamber.

The illustrated plasma process chamber 10 includes an RF coupling electrode, not shown, that is connected to receive RF power from the output of a conventional RF power supply 12. The RF coupling electrode functions to couple RF power to a plasma within the chamber. For example, the RF electrode may be a capacitively coupled electrode, an induction coil, or a microwave waveguide. The process chamber also may receive electrical power from one or more additional electrical power supplies, not shown, such as a microwave, RF or DC power supply.

A conventional process controller 16, typically a programmable computer, implements the sequence of steps, referred to as process steps, required to perform a manufacturing process on a workpiece within the chamber. For example, the process controller sends control signals to robots that transfer the workpiece and to gas valves that regulate the flow of process gases into and out of the chamber.

Of importance to the invention, the process controller controls the frequency of the RF power output produced by the RF power supply 12 by transmitting to the power supply a frequency control signal FC, which is an analog or digital electrical signal whose value represents the desired frequency. In addition, the process controller controls whether the RF power supply output is on or off by transmitting to the power supply a process control signal PC, which can be a binary electrical signal.

A conventional RF impedance matching network 14 is connected between the output of the power supply and the process chamber for the purpose of matching the RF output impedance of the power supply to the load impedance presented by the process chamber. In some conventional systems, the impedance match is optimized by adjusting capacitors or inductors within the matching network without adjusting the frequency of the RF power supply.

In other conventional systems, referred to as variable frequency impedance matching, the impedance matching method includes adjusting the frequency of the RF power supply. In variable frequency impedance matching systems, the power supply frequency changes in response to changes in the load impedance presented by the process chamber. This is the type of impedance matching system for which the present invention is most effective. The following discussion assumes the process controller is programmed to control the frequency of the power supply to optimize the impedance match. However, all aspects of the invention apply also to a system in which the power supply frequency is controlled by an impedance matching controller apparatus that is either built into the power supply or is housed separately from either the power supply or the process controller.

As stated in the Background of the Invention, a malfunction or other abnormal condition sometimes occurs while a workpiece is undergoing processing within a plasma process chamber. Such malfunction or other abnormal condition can be a damaged chamber component, a chamber component that requires cleaning or other routine maintenance, or a damaged workpiece such as a cracked glass substrate. If a plasma process is not halted after the occurrence of a serious abnormal condition, there is a risk of producing more serious damage to the chamber components or the workpiece. Therefore, it is important to detect a malfunction or other abnormal condition within the chamber as quickly as possible so that the plasma process can be halted.

The invention is based on the discovery that a malfunction or other abnormal condition within the process chamber usually changes the frequency of the RF power supply 12. Specifically, a serious abnormal condition within the process chamber 10 usually changes the characteristics of the plasma within the chamber, which consequently changes the load impedance presented by the chamber to the RF power supply. This causes the conventional impedance matching algorithm in the process controller 16 to change the frequency of the RF power supply so as to restore an optimum impedance match between the power supply and the changed load impedance presented by the chamber.

Figure 2:
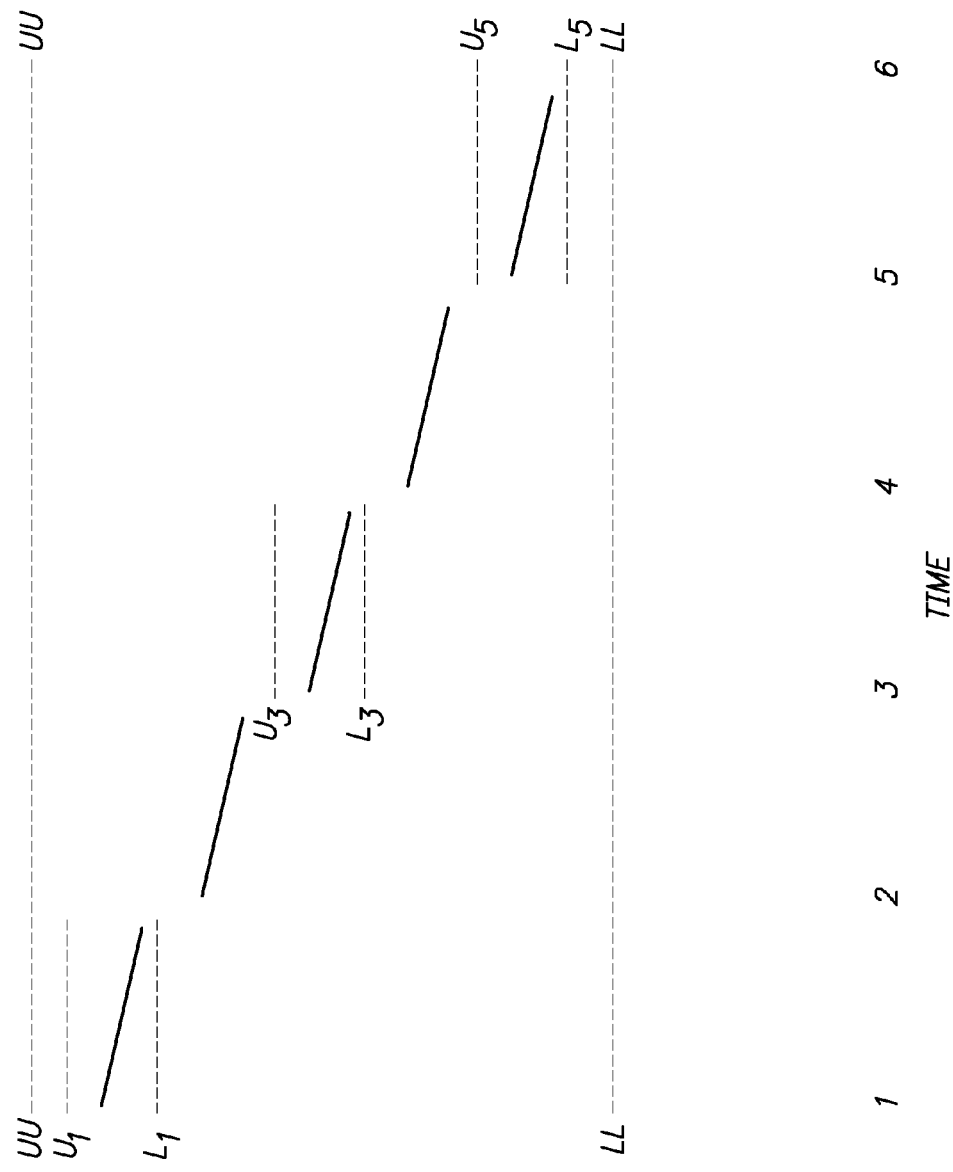
FIG. 2 is a graph showing the frequency of the RF power supply as a function of time during normal plasma processing of a sequence of five workpieces.
Figure 3:
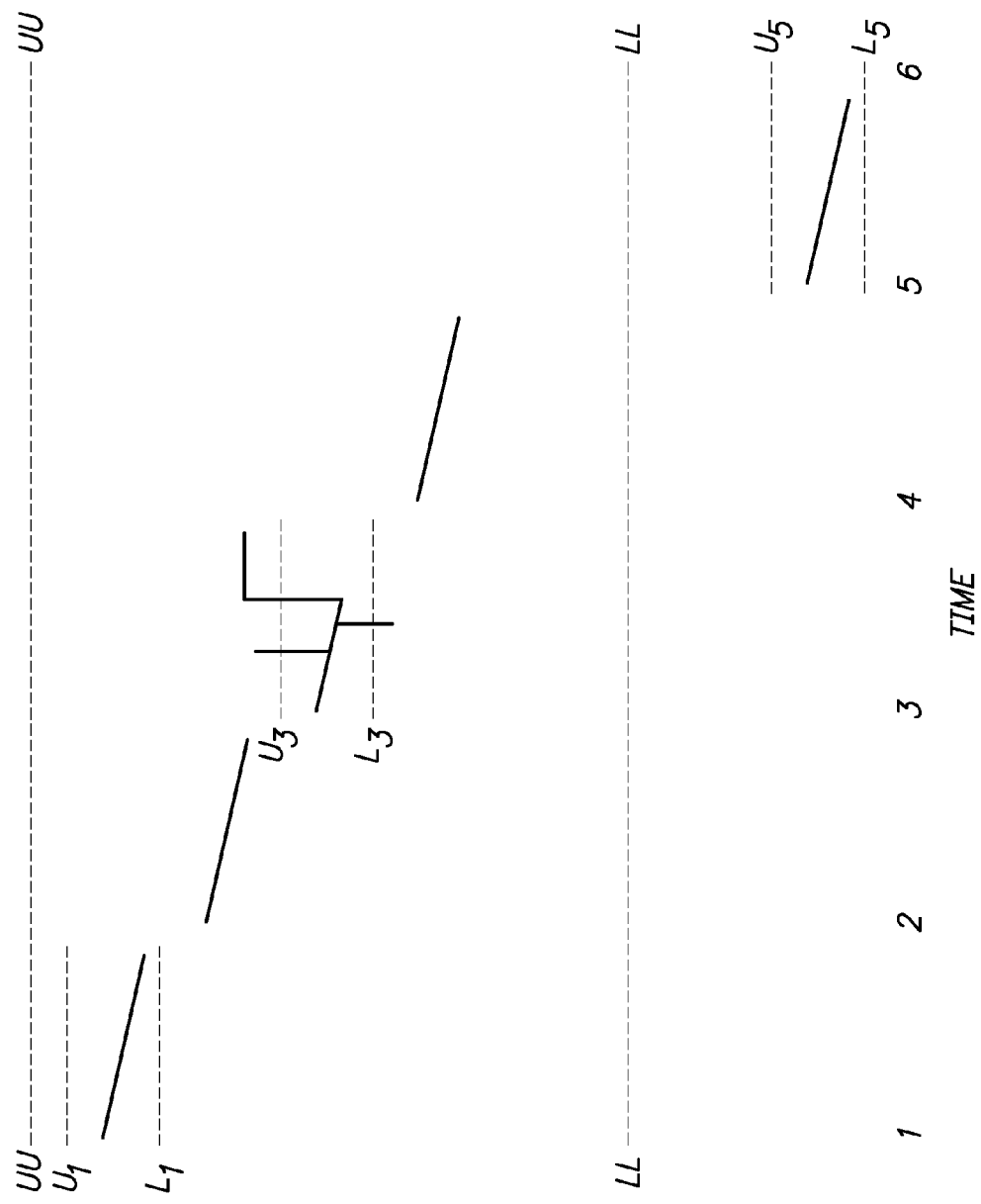
FIG. 3 is a graph like that of FIG. 2, but illustrating abnormal conditions during plasma processing of the third and fifth substrates.

FIGS. 2 and 3 are graphs showing the frequency of the RF power supply 12 as a function of time for five workpieces successively processed in a plasma-enhanced chemical vapor deposition (PECVD) process chamber 10. In the illustrated process, each workpiece is a glass substrate on which a liquid crystal display is being manufactured, and a single deposition step is performed on each substrate. The vertical axis represents the frequency of the RF power supply, and the horizontal axis represents time, where the first workpiece is processed between time 1 and time 2, the second workpiece is processed between time 2 and time 3, etc., until the fifth workpiece is processed between time 5 and time 6.

FIG. 2 illustrates the variations in power supply frequency that can occur in a normally operating plasma process chamber, and FIG. 3 illustrates the frequency deviations that might be caused by plasma arcing and cracks in the workpiece during processing of the third workpiece and by several broken susceptor ground straps before beginning processing of the fifth workpiece. In FIG. 3, the plasma arcing produces the two illustrated narrow frequency spikes, one upward and one downward. The subsequent cracking of the glass substrate of the third workpiece causes the frequency to jump upward for the remainder of the processing of the third workpiece. The broken ground straps during the transfer of the fourth workpiece out of the chamber and the transfer of the fifth workpiece into the chamber cause the power supply frequency to be markedly lower when RF power resumes for processing the fifth workpiece.

The invention is intended to detect frequency deviations such as those shown in FIG. 3. Broadly, the invention establishes lower and upper frequency limits (denoted L and U) between which the frequency of the RF power supply normally remains in the absence of an abnormal condition in the process chamber. The frequency of the power supply is compared with the frequency limits. If the frequency of the power supply becomes less than the lower limit L or becomes greater than the upper limit U, the invention produces an alert signal, thereby warning of an abnormal condition in the process chamber. The comparison preferably is performed repeatedly (e.g., periodically or continuously) throughout the time the workpiece is undergoing a plasma process step in the chamber.

The invention further includes an advantageous method and apparatus for establishing the aforesaid lower and upper frequency limits. Before explaining this aspect of the invention, the variations in power supply frequency will be discussed in greater detail.

FIG. 2 shows that, for the illustrated PECVD process, the power supply frequency changes progressively during each deposition step. A major contributor to this behavior is the accumulation in the chamber of residue from chemical reaction byproducts during each deposition step, which causes the RF load impedance presented by the chamber to change progressively during each deposition step. In addition, there is a substantial abrupt change in power supply frequency between successive workpieces that can exceed the change in power supply frequency during the processing of an individual workpiece. In the illustrated process, after five workpieces are processed, the chamber is cleaned to remove the accumulated residue, so the pattern shown in FIG. 2 repeats for the next five workpieces.

Although not shown in FIGS. 2 and 3, there is also a transient in the power supply frequency when processing is initiated for each successive workpiece. The transient occurs during the initial formation of the plasma in the chamber.

The maximum power supply frequency variation during a single process step performed on a single workpiece typically is much smaller than the maximum frequency deviation among successive process steps or among multiple successive workpieces. For example, in the process illustrated in FIG. 2, the maximum power supply frequency variation within a single process step performed on a single workpiece is about 3 kHz. In contrast, during the processing of five successive workpieces, the power supply frequency ranges from 13380 kHz at the beginning of processing the first workpiece to 13345 kHz at the end of processing the fifth workpiece, for a cumulative frequency variation of 35 kHz.

2. Adaptive Frequency Limits (First Aspect of Invention)

A first aspect of the invention (FIG. 4) detects abnormal process conditions with great sensitivity by taking advantage of the relatively small power supply frequency deviation during a single process step or during the processing of a single workpiece. Shortly after the beginning of a plasma process step or the beginning of plasma processing of a workpiece (Step 101), the frequency of the RF power supply is sampled and stored in memory (Step 103), which can be a computer memory or the memory in a conventional sample-and-hold circuit. The lower and upper frequency limits (L and U) are established as a function of the sampled power supply frequency (Step 104).

The frequency of the power supply then is compared with the frequency limits as described above (Step 105). If the frequency of the power supply becomes less than the lower limit or becomes greater than the upper limit, the invention produces an alert signal A1, thereby warning of an abnormal condition in the process chamber. The comparison preferably is performed repeatedly (e.g., periodically or continuously) throughout the time the workpiece is undergoing that plasma process step (Step 106).

When the plasma process step is finished, or when processing of the workpiece within the plasma chamber is finished, the comparison or the signaling of alerts is disabled, i.e., halted (Step 106). When a new process step begins, or when plasma processing of a new workpiece begins (Step 101), the frequency of the RF power supply is sampled again and the newly sampled frequency value is stored in memory (Step 103). The lower and upper frequency limits are reestablished as a function of the latest sampled value of the power supply frequency (Step 104). The comparison between the frequency of the power supply and the frequency limits, as described above, then is resumed (Step 105).

The lower frequency limit L preferably is determined by subtracting a predetermined frequency offset from the sampled value of the power supply frequency or by multiplying such sampled value by a predetermined scale factor that is slightly less than one. Similarly, the upper frequency limit U preferably is determined by adding a predetermined frequency offset to the sampled value of the power supply frequency or by multiplying such sampled value by a predetermined scale factor that is slightly greater than one.

The predetermined offsets or scale factors preferably should be selected so that the resulting frequency limits will be only slightly outside the range of frequencies normally encountered during a single process step or the plasma processing of a single workpiece. For example, suppose that the maximum power supply frequency variation during the processing of a single workpiece is about +/−3 kHz. The predetermined frequency offset preferably should slightly greater than the maximum variation, so a suitable value for the predetermined lower and upper frequency offsets is 5 kHz.

Alternatively, if it is known that the power supply frequency always declines during a process step relative to its value at the beginning of the step, then the upper frequency offset can be smaller than the lower frequency offset. In the example of FIG. 2, suitable values of the lower and upper frequency offsets are 5 kHz and 3 kHz, respectively. When processing of the first workpiece begins at time 1, the sampled power supply frequency is 13380 kHz, so the lower and upper frequency limits are set to $L_1=13375$ kHz and $U_1=13383$ kHz, respectively. (The subscript denotes which workpiece the limits apply to.) After the limits $L_1$ and $U_1$ are established, they repeatedly would be compared with the power supply frequency during the processing of the first workpiece. Similarly, when processing of the fifth workpiece begins at time 6, the sampled power supply frequency is 13348 kHz, so the lower and upper frequency limits are set to $L_5=13343$ kHz and $U_5=13351$ kHz, respectively. After the limits $L_5$ and $U_5$ are established, they repeatedly are compared with the power supply frequency during the processing of the fifth workpiece.

FIG. 3 shows that the abnormal conditions during processing of the third workpiece would be detected by the first aspect of the invention as described up to this point. The first plasma arcing incident would be detected because it causes the power supply frequency to exceed the upper frequency limit $U_3$. The second plasma arcing incident would be detected because it causes the power supply frequency to drop below the lower frequency limit $L_3$. The cracking of the glass substrate after the arcing also would be detected because it causes the power supply frequency to exceed the upper frequency limit $U_3$.

3. Frequency Limits Not Adapted to Sampled Frequency (Second Aspect of Invention)

FIG. 3 also illustrates that the first aspect of the invention can fail to detect an equipment malfunction that occurs between process steps, that is, a malfunction that occurs during the period the RF power supply and the plasma are turned off between the end of one process step and the beginning of the next process step. The malfunction illustrated in FIG. 3 caused the power supply frequency during plasma processing of the fifth workpiece to be 35 kHz lower than during processing of the fourth workpiece. Because the lower and upper frequency limits $L_5$ and $U_5$ are established adaptively, based on the power supply frequency at the beginning of processing the fifth workpiece, the malfunction shifts the frequency limits downward by the same 35 kHz amount as the power supply frequency. Therefore, the power supply frequency never crosses the frequency limits, and the abnormal condition is not detected.

A common cause of malfunction between processing of successive workpieces, as illustrated in FIG. 3 between the fourth and fifth workpieces, is the breakage of susceptor ground straps. The pedestal or susceptor supporting the workpiece typically is lowered and raised each time a workpiece is transferred into or out of the process chamber. This movement eventually can break some of the flexible electrical ground straps connected between the movable susceptor and the fixed, electrically grounded chamber wall. In a PECVD chamber for manufacturing flat panel displays, a susceptor typically has 40 or 50 spatially distributed ground straps. If 20 percent or more of the ground straps break, the workpiece may be ruined because the film deposited by the PECVD process may not have the required characteristics. Because the susceptor movement occurs during transfer of the workpieces, breakage of the ground straps usually occurs while the RF power supply and plasma are turned off between processing of successive workpieces.

We have discovered that the breakage of susceptor ground straps causes a shift in the power supply frequency like the shift between the fourth and fifth workpieces illustrated in FIG. 3. The frequency shift is approximately proportional to the percentage of ground straps that are broken.

Figure 5:
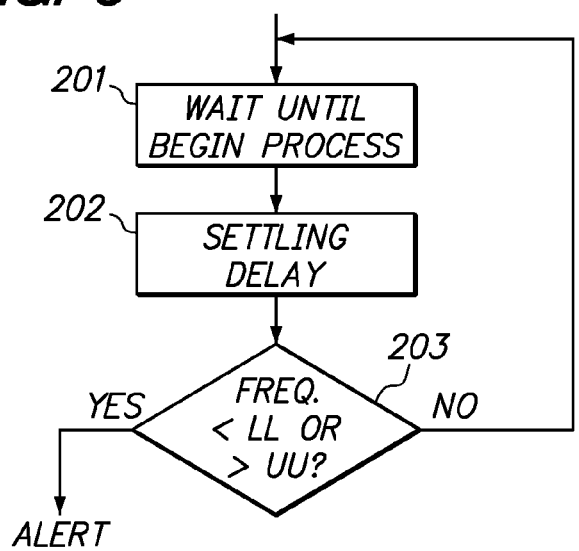
FIG. 5 is a flow chart of the method of the second aspect of the invention using non-adaptive frequency limits.

The second aspect of the invention (FIG. 5) enables detection of malfunctions that occur between process steps or between the plasma processing of successive workpieces, such as the broken ground straps just discussed. The second aspect of the invention establishes a second lower frequency limit LL and a second upper frequency limit UU that are not adapted as a function of recent samples of the power supply frequency. After a new process step begins, or after plasma processing of a new workpiece begins within the chamber (Step 201), the frequency of the RF power supply is compared with the second frequency limits (Step 203). If the power supply frequency is less than the second lower frequency limit LL or greater than the second upper frequency limit UU, an alert signal A2 is produced, thereby warning of an abnormal condition in the process chamber. This second aspect of the invention can detect malfunctions or other abnormal conditions that occur between process steps or between processing of different workpieces.

The first and second aspects of the invention can be more descriptively referred to as power supply frequency comparisons using adaptive frequency limits and non-adaptive frequency limits, respectively. For reasons that will be explained below, the adaptive and non-adaptive frequency limits also may be referred to as narrowly-spaced and widely-spaced frequency limits.

The second (non-adaptive) lower and upper frequency limits LL and UU may be fixed, or they may have different predetermined values as a function of process step parameters such as which process step is being performed or how many workpieces have been processed since the chamber was cleaned. In any event, the predetermined values of the second (non-adaptive) lower and upper frequency limits LL and UU preferably should be chosen empirically such that, when performing a given process in the absence of any serious abnormal condition in the process chamber, the observed range of power supply frequency remains between the lower and upper frequency limits LL and UU. The normal range of power supply frequency typically will be different for different processes because of differences in plasma chemistry, RF power, and other parameters. Therefore, it is preferable to empirically establish different frequency limits for each process intended to be performed in the process chamber.

Referring to the illustrative PECVD process of FIGS. 2 and 3, in the course of processing five workpieces without intervening cleaning of the chamber, the power supply frequency ranges from 13345 kHz to 13380 kHz. The second (non-adaptive) lower and upper frequency limits LL and UU preferably should be set to values slightly below and slightly above this range, respectively. For example, a suitable lower frequency limit LL is 13335 kHz, and a suitable upper frequency limit UU is 13390 kHz. FIG. 3 shows that this method would detect the illustrated malfunction between the fourth and fifth workpieces because the power supply frequency during processing of the fifth workpiece is well below the second lower limit LL.

Alternatively, if it is known that the power supply frequency consistently declines between the first workpiece and the fifth workpiece following each cleaning of the chamber, then the second (non-adaptive) lower and upper frequency limits LL and UU can be established as a function of the workpiece number. For example, the predetermined second lower and upper frequency limits could be 13365 and 13390 kHz, respectively, for the first workpiece and 13333 and 13358 kHz, respectively, for the fifth workpiece following a chamber cleaning.

Either the first aspect (adaptive limits) or the second aspect (non-adaptive limits) of the invention can be used alone, but these two aspects of the invention preferably are used together because they have complementary and synergistic advantages and shortcomings. The first aspect of the invention (with adaptive limits) has the advantage of enabling the limits to be more narrowly spaced, thereby improving the sensitivity with which abnormalities can be detected. However, a shortcoming of this aspect of the invention is that it cannot detect abnormalities that occur during times when no plasma process is being performed, such as times when workpieces are being transferred. The second aspect of the invention (with non-adaptive limits) overcomes this shortcoming; that is, it can detect abnormalities that occur at any time, including abnormalities that occur when no plasma process is being performed. However, its shortcoming is that the non-adaptive limits typically cannot be as narrowly spaced as the adaptive limits, so it may not detect abnormalities that produce relatively small frequency deviations.

In actual tests of the previously discussed PECVD process illustrated in FIG. 2, we found that cracking of the glass substrate and arcing within the plasma chamber were two types of abnormalities that were much more reliably detected by the first aspect of the invention (adaptive limits) than the second aspect of the invention (non-adaptive limits) because the adaptive limits could be more narrowly spaced. As stated above, the adaptive limits L and U could be spaced apart by only 8 kHz, whereas the fixed, non-adaptive limits LL and UU had to be spaced apart by about 55 kHz. Cracking of the glass substrate and arcing typically produced abrupt power supply frequency deviations that were large enough to trigger the abnormality alert in the comparison using the relatively narrow adaptive limits, but not large enough to trigger the abnormality alert in the comparison using the relatively wide non-adaptive limits.

Conversely, breakage of grounding straps when workpieces were being transferred into or out of the process chamber could only be detected using the non-adaptive limits of the second aspect of the invention, as already discussed. Fortunately, if the number of broken ground straps was great enough to adversely affect the spatial uniformity of the plasma process, the resulting deviation in the power supply frequency was great enough to exceed the relatively widely spaced, non-adaptive limits.

When using the first and second aspects of the invention together, it is only necessary to perform the comparison with non-adaptive limits (per the second aspect) once for each time that the adaptive limits are updated (per the first aspect), which is typically only once per process step or once per workpiece. After a comparison using non-adaptive limits confirms that no abnormality occurred before the adaptive limits were updated, the subsequent repeated comparisons using the adaptive limits suffices to detect any abnormality that may occur during the remainder of the process step.

When a new process step begins or plasma processing of a new workpiece begins, typically the plasma requires a certain time to stabilize. During this initial stabilization period, referred to as the settling time period, the power supply frequency may momentarily deviate from its normal range. Therefore, to avoid false alerts, the frequency comparisons or the triggering of alerts according to both aspects of the invention preferably should be disabled (i.e., halted) during a predetermined settling period immediately following the beginning of a new process step or the beginning of plasma processing of a new workpiece (Steps 102 and 202). This can be implemented by disabling the comparisons or the triggering of alerts during times when the RF power supply is inactive and during an initial settling period after each time the RF power supply becomes active. For the same reason, the sampling of the power supply frequency for the purpose of adapting the frequency limits according to the first aspect of the invention preferably should be delayed until after the predetermined settling period (Step 102). The settling time preferably should be determined empirically for each process, but as an example, in our tests we determined that a suitable settling time period is 1 second to 5 seconds.

To help diagnose how an abnormality alert was triggered, the first and second aspects of the invention can produce distinctive alert signals. However, this normally is unnecessary, so both aspects of the invention can produce the same alert signal in the event of an abnormality.

4. Apparatus Implementation

A programmable general purpose computer preferably implements all of the above-described sampling operations, comparison operations, determination of frequency limits, settling time delay, and signaling the alert. A conventional computer storage device connected to the computer preferably stores the values of the frequency limits and the sampled power supply frequency. Where the invention is described in the specification or claims as including one or more electrical circuits—including sample-and-hold circuits and comparator circuits—a general purpose programmable computer should be considered within the scope of such electrical circuits. Referring to FIG. 1, a programmable general purpose computer could replace all the illustrated components other than the plasma chamber 10, RF power supply 12, and RF impedance matching network 14.

The process controller 16 shown in FIG. 1 typically controls all the parameters of the process being performed within the chamber and typically produces a process control signal that can be used to initiate the settling period defined in the preceding paragraph. Such a process control signal may be produced directly by the process controller, or it may be synthesized by logically combining multiple signals produced by the process controller. For example, signals that may be produced by the process controller which are suitable for use as the process control signal that initiates the settling period include signals that indicate: (1) when the plasma chamber begins a new workpiece processing step; (2) when chemical or electrical conditions are intended to change within the plasma chamber; (3) when the RF power supply turns on or switches from standby state to active state; or (4) when the RF power supply changes from supplying a low standby power level to a power level exceeding a predetermined threshold or a power level high enough to perform a plasma process.

Both aspects of the invention require comparing the power supply frequency with lower and upper limits. A frequency counter could be connected to receive an attenuated portion of the power supply output and measure its frequency. However, typically this is unnecessary because a variable frequency power supply 12 typically receives an analog or digital frequency control signal FC that controls the frequency of the power supply output. The process controller 16 typically produces the frequency control signal FC and sends it to the frequency control input of the power supply. Therefore, the invention can receive the frequency control signal and use its value as representing the frequency of the power supply.

As an alternative to implementing the invention in a programmable computer, FIG. 1 shows an implementation by means of electrical circuits 20-38 that need not be programmable.

Figure 4:
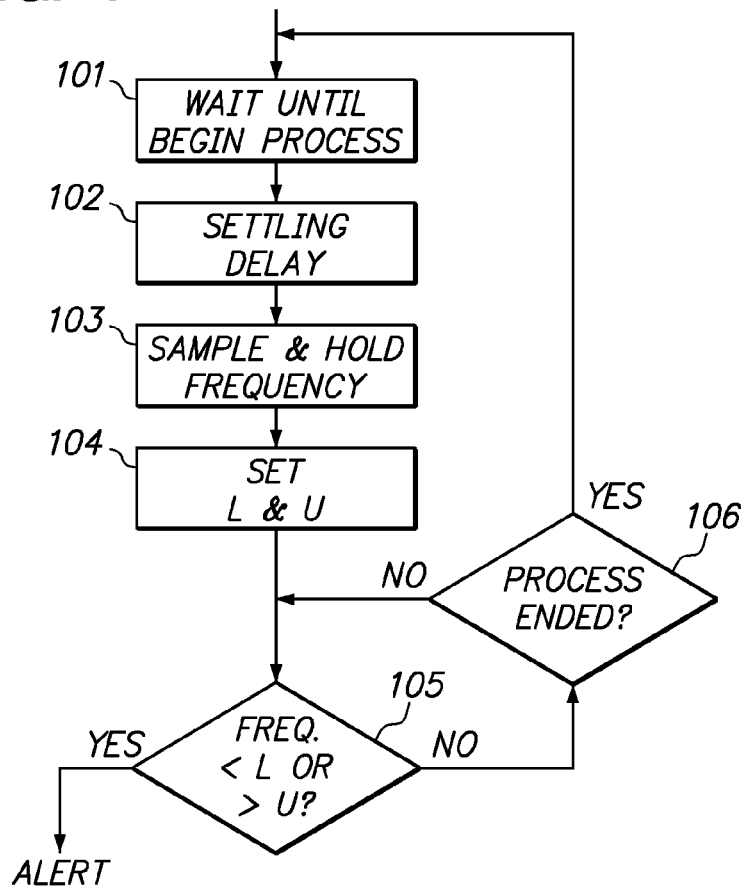
FIG. 4 is a flow chart of the method of the first aspect of the invention using adaptive frequency limits.

In the electrical circuit of FIG. 1, a conventional sample-and-hold circuit 20 implements Step 103 of FIG. 4 by sampling and storing the value of the previously described frequency control signal FC provided by the process controller 16. The preferred settling delay (Step 102 of FIG. 4 and Step 202 of FIG. 5) is provided by a conventional delay line circuit 22, which can be a shift register circuit.

The sample-and-hold circuit 20 is controlled by a sample control signal SC, which preferably is produced by an AND logic gate 24 whose inputs are the process control signal PC and the delayed version of the process control signal provided by the output of the delay line 22. The resulting sample control signal is false when the plasma process is off, becomes true after the delay imposed by the settling time delay 22 when the process control signal PC indicates the plasma process has begun, and reverts to false without delay when the process control signal PC indicates the plasma process has ended.

A first comparator circuit receives the sampled frequency from the output of the sample-and-hold circuit and determines the first lower and upper frequency limits L and U as a function of the value of the sampled frequency (Step 104 of FIG. 4). Optionally, in response to the sample control signal SC transitioning to true, the first comparator stores the first limits L and U in a memory circuit 32. The first comparator circuit produces the first alert signal A1 by comparing the frequency control signal FC to the first lower and upper frequency limits L and U (Step 105 of FIG. 4).

The predetermined values for the second lower and upper frequency limits LL and UU preferably are stored in the same memory circuit 32. The second comparator circuit produces the second alert signal A2 by comparing the frequency control signal FC to the second lower and upper frequency limits LL and UU received from the memory 32 (Step 105 of FIG. 4).

Logical OR gate 36 combines the first alert signal A1 and the second alert signal A2 to produce a composite alert signal Logical AND gate 38 disables the alert output except when the sample control signal SC is true (Steps 106 and 101 of FIG. 4; Step 201 of FIG. 5.)

The invention claimed is:

1. Apparatus for signaling when a variable-frequency RF power supply is supplying RF power to an abnormal RF impedance within a plasma chamber, comprising:

a variable-frequency RF power supply having an output and having a frequency control input connected to receive a frequency control signal, wherein the RF power supply produces RF power at its output having a frequency equal to a frequency represented by the frequency control signal;

a sample-and-hold circuit having a sample input, a control input and an output, wherein the sample input is adapted to receive the frequency control signal, wherein the control input is adapted to receive a sample control signal having at least a first state and a second state, and wherein the sample-and-hold circuit maintains at its output the value of the frequency control signal at the most recent time when the sample control signal changes from the first state to the second state; and a first comparator circuit adapted to receive the frequency control signal, wherein the first comparator circuit repeatedly compares the frequency represented by the frequency control signal to a first lower frequency limit and a first upper frequency limit and produces a first alert signal when the frequency represented by the frequency control signal is less than the first lower frequency limit or greater than the first upper frequency limit;

wherein the first comparator circuit is connected to receive the output of the sample-and-hold circuit; and wherein the first comparator circuit establishes the first lower frequency limit and the first upper frequency limit in response to the output of the sample-and-hold circuit such that the first lower frequency limit and the first upper frequency limit are respectively less than and greater than the frequency represented by the output of the sample-and-hold circuit.

2. The apparatus of claim 1, wherein:
the first comparator circuit establishes the first lower frequency limit as equal to the frequency represented by the output of the sample-and-hold circuit minus a frequency offset; and
the first comparator circuit establishes the first upper frequency limit as equal to the frequency represented by the output of the sample-and-hold circuit plus said frequency offset.

3. The apparatus of claim 1, further comprising:
a second comparator circuit adapted to receive the frequency control signal, wherein the second comparator circuit produces a second alert signal when the frequency represented by the frequency control signal is less than a second lower frequency limit or greater than a second upper frequency limit;
wherein the second lower frequency limit and the second upper frequency limit have predetermined values that are independent of the output of the sample-and-hold circuit.

4. The apparatus of claim 3, wherein the first comparator circuit and the second comparator circuit are the same comparator circuit.

5. The apparatus of claim 1, wherein:
the sample control signal changes from the first state to the second state after a predetermined delay when the plasma chamber begins a new workpiece processing step; and
the predetermined delay is greater than or equal to zero.

6. The apparatus of claim 1, wherein:
the sample control signal changes from the first state to the second state after a predetermined delay when chemical or electrical conditions change within the plasma chamber; and
the predetermined delay is greater than or equal to zero.

7. The apparatus of claim 1, wherein:
the sample control signal assumes the first state when the RF power supply is not supplying at least a predetermined level of power and changes from the first state to the second state after a predetermined delay when the RF power supply begins supplying at least said predetermined level of power; and
the predetermined delay is greater than or equal to zero.

8. The apparatus of claim 1, further comprising:
a controller circuit that adjusts the frequency control signal so as to optimize an impedance match at the output of the RF power supply.

9. A method of signaling when a variable-frequency RF power supply is supplying RF power to an abnormal RF impedance within a plasma chamber, comprising the steps of:
coupling to a variable frequency RF power supply a frequency control signal that controls the frequency of RF power supplied by the RF power supply, wherein the frequency control signal has a value that represents said frequency;
storing in a memory circuit the value of the frequency control signal;
establishing a first lower frequency limit and a first upper frequency limit such that the first lower frequency limit and the first upper frequency limit are respectively less than and greater than the frequency represented by the value stored in the memory circuit;
repeatedly comparing the frequency represented by the frequency control signal to the first lower frequency limit and the first upper frequency limit so as to determine whether the frequency represented by the frequency control signal is less than the first lower frequency limit or greater than the first upper frequency limit; and
producing a first alert signal when the comparing step determines that the frequency represented by the frequency control signal is less than the first lower frequency limit or greater than the first upper frequency limit.

10. The method of claim 9, wherein the establishing step comprises:
establishing the first lower frequency limit as equal to the frequency represented by the memory circuit minus a frequency offset; and
establishing the first upper frequency limit as equal to the frequency represented by the memory circuit plus said frequency offset.

11. The method of claim 9, further comprising the step of:
producing a second alert signal when the frequency represented by the frequency control signal is less than a second lower frequency limit or greater than a second upper frequency limit;
wherein the second lower frequency limit and the second upper frequency limit have predetermined values that are independent of the value stored in the memory circuit.

12. The method of claim 11, further comprising:
disabling the producing of the first and second alert signals during times when the RF power supply is inactive and during an initial settling period after each time the RF power supply becomes active.

13. The method of claim 11, wherein:
the first lower frequency limit is greater than or equal to the second lower frequency limit; and
the first upper frequency limit is less than or equal to the second upper frequency limit.

14. The method of claim 11, wherein the first alert signal and the second alert signal are the same.

15. The method of claim 11, wherein:
the predetermined values of the second lower frequency limit and the second upper frequency limit are such that, during normal operation of the plasma chamber, the frequency of the RF power supply remains between the second lower frequency limit and the second upper frequency limit.

16. The method of claim 9, further comprising:
disabling the producing of the first alert signal during times when the RF power supply is inactive and during an initial settling period after each time the RF power supply becomes active.

17. The method of claim 16, wherein the establishing step comprises:
establishing the first lower frequency limit and the first upper frequency limit such that, during the processing of a single workpiece within the plasma chamber subsequent to the initial settling period, the frequency of the RF power supply remains between the first lower frequency limit and the first upper frequency limit.

18. The method of claim 16, wherein the establishing step comprises:
establishing the first lower frequency limit and the first upper frequency limit such that, during the performing of a single process step within the plasma chamber subsequent to the initial settling period, the frequency of the RF power supply remains between the first lower frequency limit and the first upper frequency limit.

19. The method of claim 9, further comprising the step of:
providing a plasma within a plasma chamber;
wherein the step of coupling to a variable frequency RF power supply a frequency control signal further comprises the step of supplying RF power from the RF power supply to the plasma, wherein the RF power supply establishes the frequency of the RF power in response to the value of the frequency control signal.

20. The method of claim 9, further comprising the steps of:
providing a sample-and-hold circuit having a sample input and a control input;
coupling the frequency control signal to the sample input; and
coupling to the control input a sample control signal having at least a first state and a second state;
wherein, when the sample control signal changes from the first state to the second state, the sample-and-hold circuit performs said step of storing in the memory circuit the value of the frequency control signal.

21. The method of claim 20, further comprising the step of:
changing the sample control signal from the first state to the second state after a predetermined delay when the plasma chamber begins a new workpiece processing step;
wherein the predetermined delay is greater than or equal to zero.

22. The method of claim 20, further comprising the step of:
changing the sample control signal from the first state to the second state after a predetermined delay when a plasma is initiated in the plasma chamber after a new workpiece is transferred into the plasma chamber;
wherein the predetermined delay is greater than or equal to zero.

23. The method of claim 20, further comprising the step of:
changing the sample control signal from the first state to the second state after a predetermined delay when chemical or electrical conditions change within the plasma chamber;
wherein the predetermined delay is greater than or equal to zero.

24. The method of claim 20, further comprising the steps of:
setting the sample control signal to the first state when the RF power supply is not supplying at least a predetermined level of power; and
changing the sample control signal from the first state to the second state after a predetermined delay when the RF power supply begins supplying at least said predetermined level of power;
wherein the predetermined delay is greater than or equal to zero.

25. The method of claim 24, wherein the predetermined level of power is a level of power high enough to perform a plasma process within a plasma chamber.

26. The method of claim 9, further comprising the steps of:
providing the variable-frequency RF power supply such that the RF power supply includes an output, wherein the RF power supply, in response to the frequency control signal, supplies said RF power at said output; and
adjusting the frequency control signal so as to optimize an impedance match at the output of the RF power supply.

27. A method of signaling when a variable-frequency RF power supply is supplying RF power to an abnormal RF impedance within a plasma chamber, comprising the steps of:
providing a variable-frequency RF power supply having an output;
coupling to the RF power supply a frequency control signal having a value that represents a frequency;
the RF power supply, in response to the frequency control signal, producing RF power at its output having a frequency equal to the value represented by the frequency control signal;
adjusting the frequency control signal so as to optimize an impedance match at the output of the RF power supply;
establishing a lower frequency limit and an upper frequency limit; and
producing an alert signal when the frequency represented by the frequency control signal is less than the lower frequency limit or greater than the upper frequency limit.

28. The method of claim 27, further comprising the step of:
disabling the producing of the alert signal during times when the RF power supply is inactive and during an initial settling period after each time the RF power supply becomes active.

* * * * *